United States Patent
van Amerom

(10) Patent No.: US 6,803,818 B2
(45) Date of Patent: Oct. 12, 2004

(54) METHOD AND APPARATUS FOR IMPROVED OUTPUT POWER LEVEL CONTROL IN AN AMPLIFIER CIRCUIT

(75) Inventor: Johannes Herman Maurits van Amerom, Reeuwijk (NL)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/304,648

(22) Filed: Nov. 26, 2002

(65) Prior Publication Data

US 2004/0100325 A1 May 27, 2004

(51) Int. Cl.[7] .............................................. H03F 1/30
(52) U.S. Cl. .................... 330/144; 330/284; 330/279
(58) Field of Search .............................. 330/144, 284, 330/279, 129, 136, 207 P, 298; 327/307

(56) References Cited

U.S. PATENT DOCUMENTS 3,458,826 A * 7/1969 Lalande et al. ............. 330/2
4,547,746 A * 10/1985 Erickson et al. ........... 330/298
5,977,831 A * 11/1999 Davis et al. ................ 330/279
6,577,196 B2 * 6/2003 Hart .......................... 330/279
6,597,244 B2 * 7/2003 Tichauer .................... 330/298

* cited by examiner

Primary Examiner—Henry Choe

(57) ABSTRACT

An amplifier circuit having a controllable output power level comprises an attenuator configurable for receiving an input signal and operative to control an attenuation thereof, and an amplifier coupled to the attenuator, the amplifier receiving the attenuated input signal and generating an amplified output signal. The amplifier circuit further includes at least one power detector configurable to independently detect at least a portion of an incidental wave and a reflected wave corresponding to the amplified output signal and to generate first and second signals representative of the detected incidental and reflected waves, respectively. A controller is coupled between the power detector and the attenuator in a feedback configuration, the controller controlling the attenuation of the input signal and/or an amplification of the input signal as a function of the first and second signals from the power detector. In this manner, the output signal of the amplifier circuit is substantially maintained at a predetermined power level.

21 Claims, 4 Drawing Sheets

METHOD AND APPARATUS FOR IMPROVED OUTPUT POWER LEVEL CONTROL IN AN AMPLIFIER CIRCUIT

FIELD OF THE INVENTION

The present invention relates generally to power control circuitry, and more particularly relates to techniques for improving output power control in an amplifier circuit.

BACKGROUND OF THE INVENTION

In wireless transmission systems, amplifier circuits may be employed, for example, in a transmitter section of a network interface card (NIC). Such amplifier circuits are generally required to provide, among other characteristics, certain guarantees of linearity and output power level control in order to insure interoperability among NICs of various manufacturers. In order to provide such guarantees, conventional wireless local area networks (LANs) are typically designed according to a specified standard, such as the Institute of Electrical and Electronics Engineers (IEEE) 802.11 standard. This standard, as set forth in the document IEEE Std. 802.11 (ISO/IEC DIS 8802–11), entitled *Supplement to IEEE Standard for Information Technology—Telecommunications and Information Exchange Between Systems—Local Metropolitan Area Networks—Specific Requirements—Part 11: Wireless LAN Medium Access Control (MAC) and Physical Layer (PHY) Specifications,* 1999 Edition, which is incorporated herein by reference, describes, among other things, the radio frequency (RF) range, data speed, modulation and acceptable power levels of the output signal of the NIC.

In order to meet the requirements set forth in the IEEE 802.11 standard, and in the supplements relating thereto, conventional power amplifier circuits generally utilize some form of power control loop (PCL) to help maintain a relatively constant output signal from an RF power amplifier (PA) in the NIC to an antenna, regardless of variations in, for example, input signal, output signal (e.g., as a consequence of additional circuits between the output of the RF PA and an RF sensor), antenna mismatch (e.g., as a consequence of antenna position relative to certain objects), voltage supply and temperature. According to IEEE 802.11, for binary phase shift keying (BPSK) modulation, a data rate of one megabit per second (Mb/s) is supported. For quadrature phase shift keying (QPSK) modulation, IEEE 802.11 supports data rates of 2 Mb/s, 5.5 Mb/s and 11 Mb/s.

Both the BPSK and QPSK modulation techniques result in a relatively constant envelope of the modulated signal. However, as the data rate increases (e.g., 54 Mb/s) the 1 decibel (dB) compression point, a measure of the linearity of an active component, increases significantly beyond an average power of the amplifier. For example, for low data rate BPSK or QPSK, the 1 dB compression point of the PA must be approximately 3 to 4 dB above the average power in order to guarantee sufficient linearity for errorless transmissions. For a 64-bit quadrature amplitude modulation (64-QAM) technique, the peak-to-average power (PAP) ratio of the modulated carrier is approximately 10 dB. For a PA that generates a 15 dBm average power level (where dBm may be defined as a unit for expression of power level in dB with a reference to a power of one milliwatt), the 1 dB compression point will be at approximately 25 dBm output power in order to guarantee sufficient linearity.

There is a need, therefore, for improved power control techniques for controlling an output power level of an amplifier circuit so as to guarantee a substantially constant output signal of the amplifier circuit, with sufficient linearity.

SUMMARY OF THE INVENTION

The present invention provides techniques for controlling an output power level in an amplifier circuit such that an envelope of the output signal is held substantially constant while providing a desired linearity in the output signal. The power control techniques of the present invention are particularly well-suited for use in a network interface card application constructed in accordance with, for example, the IEEE 802.11 standard.

In accordance with one aspect of the invention, an amplifier circuit having a controllable output power level comprises an attenuator configurable for receiving an input signal and operative to control an attenuation thereof, and an amplifier coupled to the attenuator, the amplifier receiving the attenuated input signal and generating an amplified output signal. The amplifier circuit further includes at least one power detector configurable to independently detect at least a portion of an incidental wave and a reflected wave corresponding to the amplified output signal and to generate first and second signals representative of the detected incidental and reflected waves, respectively. A controller is coupled between the power detector and the attenuator in a feedback configuration, the controller controlling the attenuation of the input signal and/or an amplification of the input signal as a function of the first and second signals from the power detector. In this manner, the output signal of the amplifier circuit is substantially maintained at a predetermined power level.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative power amplifier circuit. It should be appreciated, however, that the present invention is not limited to this or any particular amplifier circuit configuration and/or application. Rather, the invention is more generally applicable to techniques for controlling an amplifier such an output signal generated by the amplifier is maintained at a substantially constant level. Also, although particularly well-suited for use in conjunction with the IEEE 802.11 standard, the invention can be used with other standards as well as non-standard systems.

Figure 1:
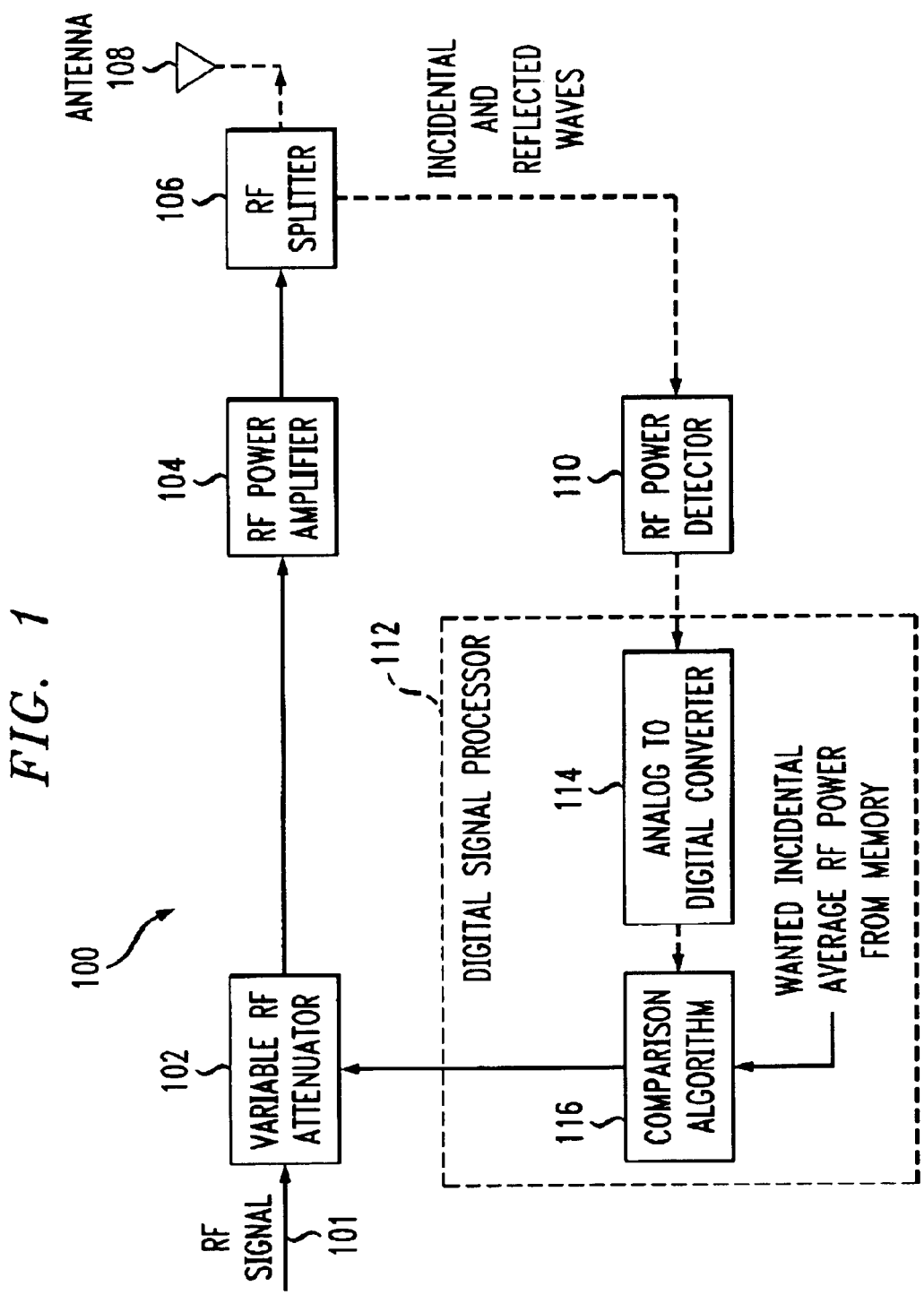
FIG. 1 is a block diagram illustrating a power control loop (PCL) circuit including an RF power splitter.

FIG. 1 illustrates a block diagram depicting a power control loop (PCL) circuit 100 which may be used in a single or multiple carrier system. The PCL circuit 100 includes a variable attenuator 102, an RF power amplifier 104 coupled to the variable attenuator 102, an RF splitter 106 coupled to an output of the RF power amplifier (PA) 104, an antenna 108 coupled to the RF splitter 106, an RF power detector 110 coupled to the RF splitter 106, and a digital signal processor (DSP) 112 coupled to the RF power detector 110 and the variable attenuator 102 in a feedback arrangement. The RF splitter 106 in circuit 100 is used for sampling the power generated by the RF power amplifier 104. The antenna 108 is used in a conventional manner, namely, to transmit at least a portion of the output signal from the RF PA 104.

An input RF signal 101, such as from a preamplifier, is presented to the variable attenuator 102. The signal from the attenuator 102 will be amplified by the RF PA 104 and fed to the RF splitter 106, where a portion of the signal will be transmitted by antenna 108 and a portion will be fed to the RF power detector 110. The RF power detector 110 will convert the received RF power into an equivalent direct current (DC) scaled voltage signal. This DC signal is presented to the DSP 112 where it is monitored by an analog-to-digital converter (ADC) 114 in the DSP. The ADC 114 outputs a digital code which is representative of the DC input signal applied thereto. A comparison algorithm 116 running in the DSP 112 compares the digital code generated by the ADC 114 with a stored digital code representative of a desired average RF power level transmitted by the circuit 100. The result of this comparison is then used to generate a signal for controlling the variable attenuator 102 such that the desired average RF power level is maintained.

In the PCL circuit 100, incidental and reflected waves monitored by the RF splitter 106 will produce a standing RF wave pattern. This standing wave pattern will generate certain minimum and maximum voltages at specific points along a transmission line between the output of the RF PA 104 and the antenna 108. Consequently, the position of the RF splitter 106 along the transmission line is critical in that the power generated by the splitter to the RF power detector 110 will change with the position of the splitter. Moreover, the electrical operation point of the RF PA 104 will change as a consequence of the reflected waves.

The operation and performance of PCL circuit 100 relies on substantial attenuation of the reflected waves in the signal fed to the power detector 110. This attenuation of the reflected waves maybe accomplished by maintaining an ideal load impedance, thus minimizing mismatches between the output of the PA 104 and the antenna 108, and/or by placing sufficient isolation between the antenna and the RF splitter. However, a primary disadvantage of PCL circuit 100 is that, assuming isolation is employed, the isolation must be placed outside the control loop and will therefore not be compensated by the algorithm 116 running in the DSP 112.

Figure 2:
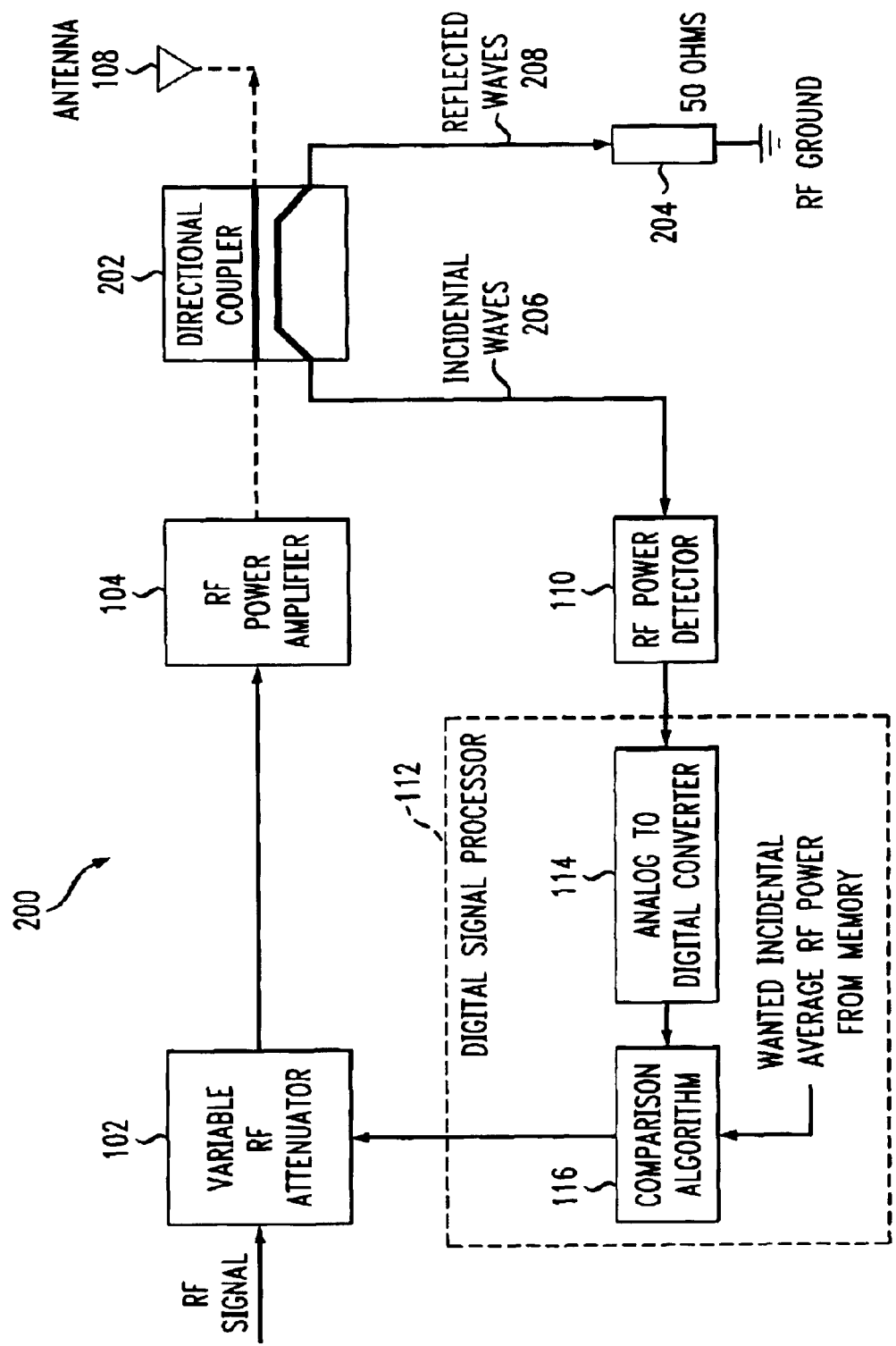
FIG. 2 is a block diagram illustrating a PCL circuit including a directional coupler, the PCL circuit being configured to monitor incidental waves.

FIG. 2 illustrates a block diagram depicting an alternative power control loop (PCL) circuit 200 which may be used in a single carrier system. Like the PCL circuit 100 shown in FIG. 1, PCL circuit 200 includes a variable attenuator 102, an RF PA 104 connected to the variable attenuator 102, an antenna 108, an RF power detector 110 for receiving at least a portion of the output signal from the RF PA 104, and a DSP 112 coupled to the RF power detector 110 and the variable attenuator 102 in a feedback arrangement. The DSP 112 similarly includes an ADC 114 for monitoring a DC input signal that is representative of the RF power generated by the RF PA 104, and a comparison algorithm 116 running in the DSP 112 for comparing the monitored power level with a stored desired power level for the circuit.

The PCL circuit 200 includes a directional coupled 202 which is employed in place of the RF splitter 106 depicted in FIG. 1. Like the RF splitter, the directional coupler 202 receives the output signal from the RF PA 104 and sends a portion of the output signal to the antenna 108 for transmission. The directional coupler 202 includes an incidental port 206 and a reflected port 208. A load resistor 204 is coupled to the reflected port 208. At least a part of the incidental waves associated with the RF power signal generated by the RF PA 104 is sampled by the directional coupler 202 at the incidental port 206 and fed to the RF power detector 110, which operates in a manner consistent with that previously described in conjunction with FIG. 1, while the reflected waves associated with the sampled RF power signal are absorbed by the load resistor 204. The value or resistor 204 may typically be about 50 ohms.

As in the PCL circuit of FIG. 1, in the PCL circuit 200, the incidental and reflected waves monitored by the directional coupler 202 will produce a standing wave pattern. The standing wave pattern will generate minimum and maximum voltages at certain points along a transmission line between the output of the RF PA 104 and the antenna 108. However, since the directional coupler 202 generally has a physical length of one quarter (¼) the traveling wavelength, the position of the directional coupler along the transmission line can be freely chosen, as will be understood by those skilled in the art. Since only the incidental port 206 is connected to the RF power detector 110, the incidental power from the RF PA 104 to the antenna 108 is maintained substantially constant, despite the influence of the reflected waves on the PA 104.

Reflected waves from the antenna can significantly modify the electrical operating point of the RF PA 104, particularly the final (output) stage in the PA. The standing wave pattern may generate either a current sum or a voltage sum at the output of the RF PA 104. A current sum is generally not of concern for the RF PA, assuming enough drive power is available from the final stage in the PA and the PA is able to handle the total current. However, a voltage sum at the output of the RF PA can be problematic for the PA due, at least in part, to a limited voltage supply range of the PA and maximum breakdown voltages associated with the semiconductor process in which the devices constituting the PA are fabricated.

A primary disadvantage of the PCL circuit 200 can be explained on the basis of the following illustrative scenario. Assume that the load condition is forcing a voltage sum on the output of the RF PA 104. Further, assume that the voltage supply of the RF PA 104 is too low to support the output voltage swing requirements of the PA and that the PA is operating in a highly non-linear mode. Only the incidental power is monitored by the RF power detector 110 at the incidental port 206 of the directional coupler 202. The comparison algorithm 116 running in the DSP 112 will only maintain a constant incidental power. This can result in a highly overdriven RF PA 104, which was already operating in a non-linear mode.

The IEEE 802.11 standard is extended with, among other things, a g-supplement, referred to as document IEEE Std. 802.11g, entitled *Further High Data Rate Extension in the 2.4 GHz Band*, September 2000, which is incorporated herein by reference. The IEEE 802.11g standard describes an enhanced modulation technique, namely, orthogonal frequency division multiplexing (OFDM) modulation, operating at a frequency in the range of 2.4 gigahertz (GHz). An a-supplement of the IEEE 802.11 standard, referred to as document IEEE Std. 802.11a, entitled *High Speed Physical Layer in the 5 GHz Band*, February 2000, which is incorporated herein by reference, describes OFDM modulation in the 5 GHz frequency band. The enhanced modulation technique enables higher data rates, as shown in Table 1 below.

TABLE 1

| Modulation Technique | Data Rate (Mb/s) |
| --- | --- |
| Binary Phase Shift Keying (BPSK) | 6 |
| BPSK | 9 |
| Quadrature Phase Shift Keying (QPSK) | 12 |
| QPSK | 18 |
| 16-Bit Quadrature Amplitude Modulation (16-QAM) | 24 |
| 16-QAM | 36 |
| 64-Bit Quadrature Amplitude Modulation (64-QAM) | 48 |
| 64-QAM | 54 |

The higher data rate QAM techniques demand significant linearity of the PA. As previously stated, the PAP ratio of the 64-QAM OFDM modulated carrier may be approximately 10 dB. For a PA that generates a 15 dBm average power level, the 1 dB compression point should be at about 25 dBm output power. In practice, a PA should also compensate for the additional loss in the receiver front-end, which is a number on top of a back-off power figure of approximately 1.5 dB, in order to improve production yield. This implies that a PA should be able to generate an average RF power level of 18 dBm, with a 1 dB compression point at 28 dBm and a saturation level of a few dB above this 28 dBm number in order to guarantee sufficient linearity of the amplifier circuit. Constructing a PA for an OFDM modulation carrier of 64-QAM, which enables a data rate of 54 Mb/s, is therefore a challenging design task, especially when considering low current requirements.

Figure 3A:
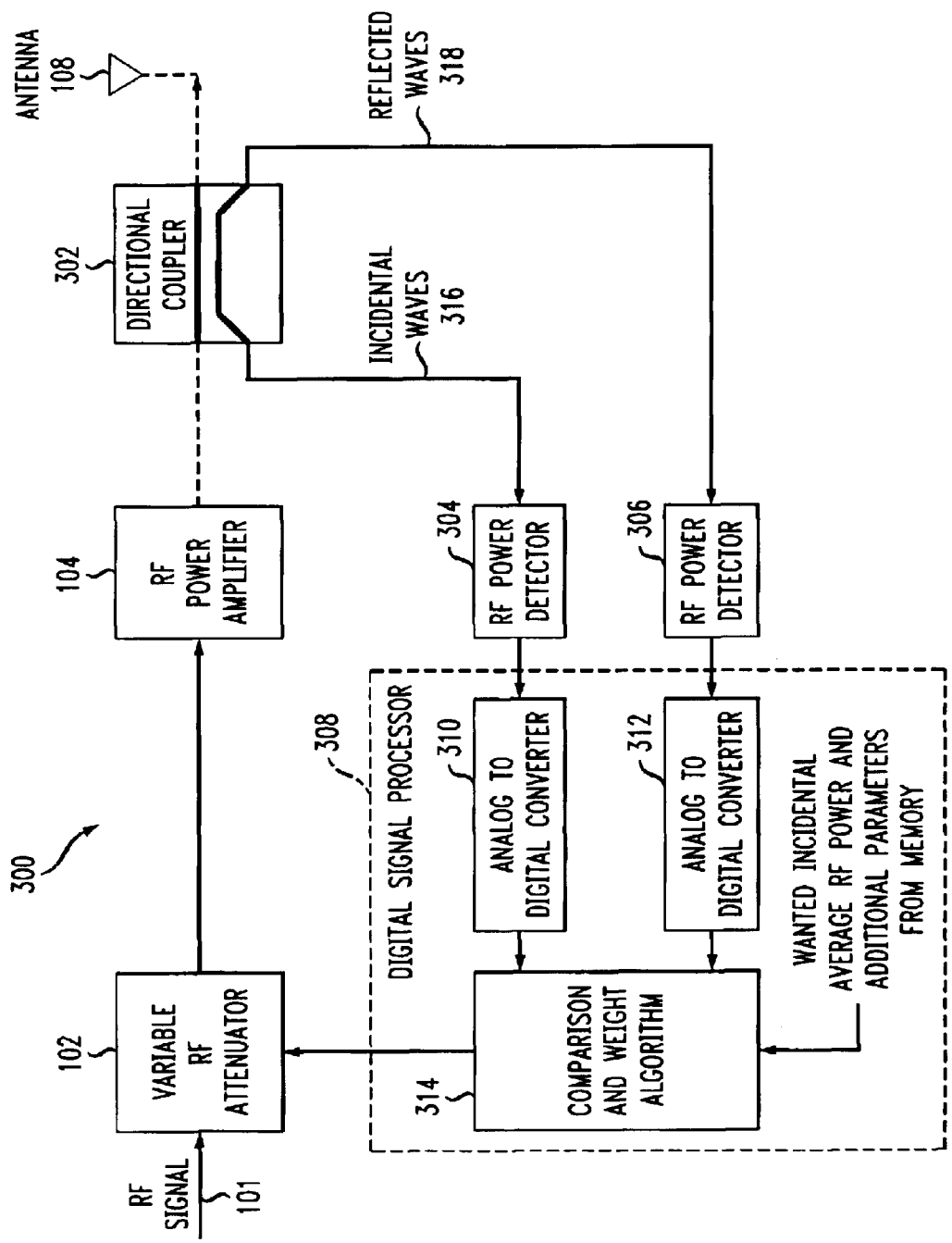
FIG. 3A is a block diagram illustrating an exemplary PCL circuit including a directional coupler, the PCL circuit being configured to monitor both incidental and reflected waves, formed in accordance with the present invention.

FIG. 3A depicts an exemplary PCL circuit 300, formed in accordance with the present invention, which advantageously overcomes the above-stated problems associated with conventional power amplifier circuits. PCL circuit 300 is particularly well-suited for use with, for example, the IEEE 802.11 standard. As apparent from the figure, the illustrative PCL circuit 300 preferably includes a variable attenuator 102, a power amplifier, such as, for example, RF power amplifier 104, coupled to the variable attenuator 102, a directional coupler 302 operatively connected to RF power amplifier (PA) 104, an antenna 108 connected to the directional coupler 302, a pair of power detectors, such as, for example, RF power detectors 304 and 306, connected to the directional coupler 302, and a controller 308, which may comprise, for example, a DSP, operatively coupled to the two power detectors 304, 306, and to the variable attenuator 102 in a feedback configuration. The variable attenuator 102 may be implemented in accordance with a circuit which is configured for receiving a control signal and for varying an attenuation of an input signal 101 presented to the circuit in response to the control signal, as will be understood by those skilled in the art. The PA 104 is preferably capable of amplifying signals in the RF range, although the PA 104 is not limited to operation in the RF spectrum.

An input RF signal 101 is preferably presented to the variable attenuator 102 from a previous circuit, such as, for example, a mixer or preamplifier stage. The signal from the attenuator 102 is then amplified by the RF PA 104. The output signal from the PA 104 is fed through directional coupler 302 where at least a portion of the signal is transmitted via antenna 108. The directional coupler 302 preferably includes an incidental port 316 which samples at least a portion of the incidental waves generated by RF PA 104, and a reflected port 318, which samples at least a portion of the reflected waves generated primarily because of a load mismatch in a transmission line and/or the antenna 108 coupled to the output of the PA 104.

As will be understood by those skilled in the art, voltage standing wave ratio (VSWR) is a measure of how much transmitted power is reflected back to the PA. As stated above, reflected waves are primarily generated as a result of mismatches in the transmission line and/or antenna coupled to the output of the PA. The VSWR can also be used to determine an efficiency of the overall transmission system. A VSWR of 1:1 represents zero reflected power, or a transmission efficiency of 100 percent, and is essentially unattainable. A relatively high reflected power (e.g., 25 percent) can damage an output stage in the PA. As a safeguard, many PAs typically reduce their output power when a high reflected power level is detected, thus protecting the PA from damage. Additionally, reflected power results in a loss of forward or incidental power. By way of example only, a VSWR of 1:3.0 results in an output power loss of 25 percent, which corresponds to a 1.25 dB loss. A detailed description of VSWR, as well as incidental and reflected waves, may be found, for example, in the text R. Dean Straw, *The ARRL Antenna Book*, American Radio Relay League, 19th Ed., September 2000, which is incorporated herein by reference.

The directional coupler 302 employed with the present invention maybe integrated with the PCL circuit, such as residing on the same semiconductor substrate. Several integrated directional couplers suitable for use with the present invention are conventionally available (dual or single band) for operation in the frequency bands of 2.4 GHz and 5 GHz. The physical dimensions of the directional coupler can be small when the dielectric constant or relative permittivity ($\epsilon_R$) of the material used to form the directional coupler is high (e.g., $\epsilon_R \geq 80$). Operating bandwidth, coupling flatness, coupling accuracy, voltage standing wave ratio (VSWR), and power handling (e.g., insertion loss) are some important factors affecting the design of the directional coupler 302.

The sampled incidental and reflected wave signals from directional coupler 302 are fed to power detectors 304 and 306, respectively. Each of the detectors 304, 306 will preferably convert the received RF power into equivalent incidental and reflected DC scaled voltage signal, respectively. These incidental and reflected DC signals are presented to the DSP 308 where they are monitored by corresponding analog-to-digital converters (ADCs) 310 and 312, respectively, residing in the DSP. Each of the ADCs 310, 312 preferably outputs a signal comprising a digital code which is representative of the DC input signal applied thereto. A comparison and weight algorithm 314, or an alternative application program, running in the DSP 308 preferably compares the digital code generated by ADC 310 with a digital code representative of a desired incidental average RF power level which may be stored, for example, in memory (not shown) residing either internal or external to the DSP 308. Similarly, the comparison and weight algorithm 314 running in the DSP 308 preferably compares the digital code generated by ADC 312 with a stored digital code representative of a desired reflected average RF power level. Preferably, additional information corresponding to the reflected wave is also available in this configuration which may be used to monitor possible modes of operation of the PA 104, in order to limit the RF output power for certain load conditions, among other important benefits. The result of these comparisons between measured and desired incidental/reflected power levels are then used to generate a control signal for controlling the variable attenuator 102, such that a correct RF power level is generated to the antenna, thereby enabling substantially error-free transmission of an OFDM-modulated carrier, even while load conditions experienced by the PA may be less than ideal.

An exemplary detector suitable for use with the present invention may comprise a demodulating logarithmic amplifier (log amp). A log amp detector accurately converts an applied input signal (e.g., RF signal) to an equivalent decibel-scaled value at its DC output. Application of a log amp as a power detector includes such advantages as, for example, wide bandwidth (dual band applications), high dynamic range, high accuracy, fast response time, high stability over temperature and voltage supply variations, low power, ease of integration in an RF front-end integrated circuit (IC), etc. Preferably, a log amp that is capable of generating multiple RF power levels (e.g., active/passive) is used in a dual band multiple carrier system (e.g., OFDM). The high accuracy of the RF log amp detector will help limit the total calibration time required, especially in a system that is able to generate multiple power levels.

It is contemplated that, in another embodiment of the present invention, the PA 104 may include a control input (not shown) for receiving a control signal presented thereto. The control signal may be used to control a gain of the PA 104, thus providing an additional means for adjusting the output power level of the PCL. This is especially advantageous if, for example, the attenuation of attenuator 102 is fixed rather than variable. Thus, in accordance with the invention, the controller 308 may operatively control the power level of the output signal associated with the PCL circuit by varying an attenuation of the input signal, an amplification of the input signal, or a combination of both.

Figure 3B:
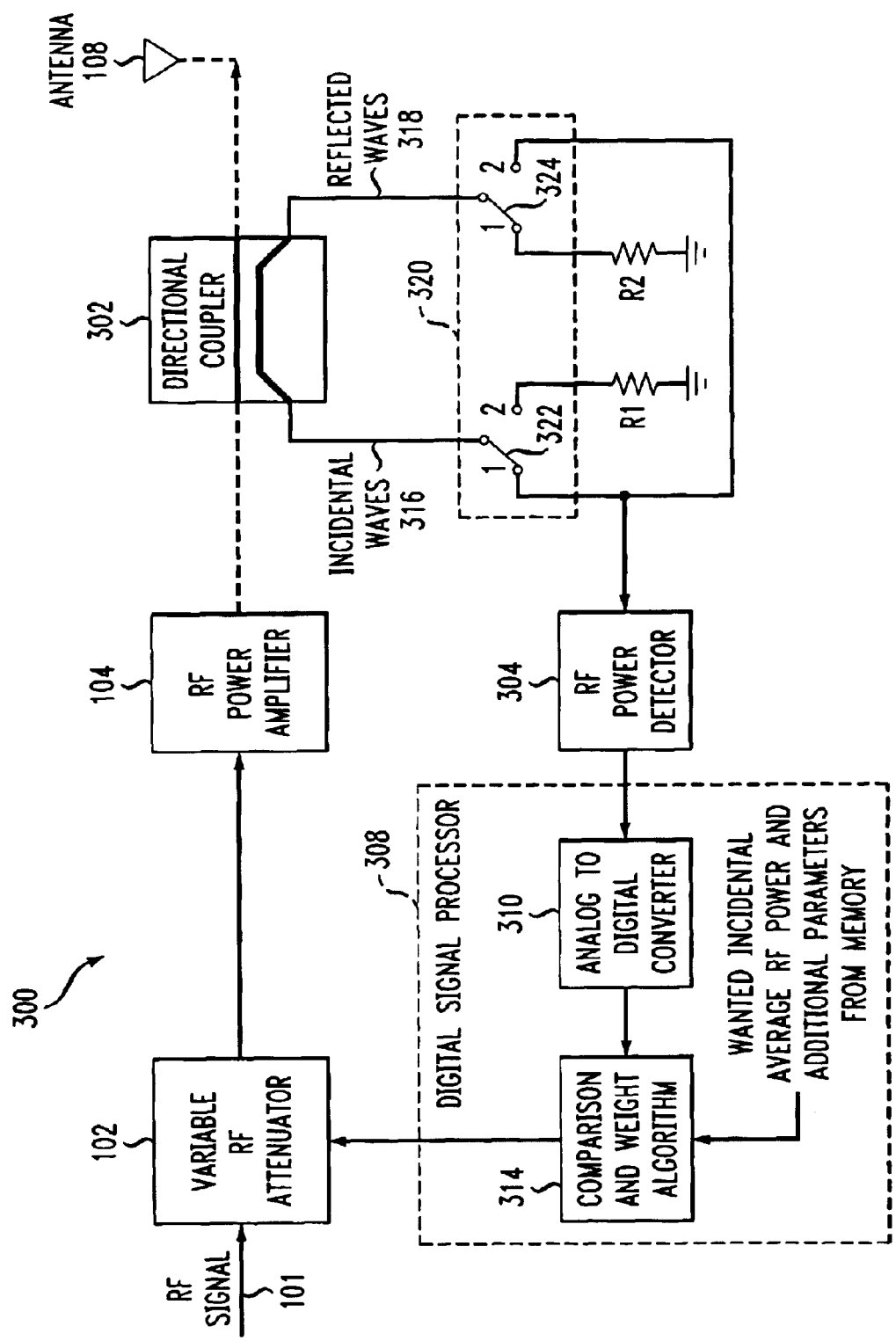
FIG. 3B is a block diagram illustrating an alternative embodiment of the exemplary PCL circuit depicted in FIG. 3A, formed in accordance with the present invention.

FIG. 3B illustrates an alternative embodiment of the PCL circuit 300 depicted in FIG. 3A. In this embodiment, rather employing two separate power detectors and corresponding ADCs, a single power detector 304 and corresponding ADC 310 maybe used in conjunction with a switching circuit 320, which may be illustrated functionally as comprising a pair of single pole double throw (SPDT) switches 322 and 324. Alternatively, switching circuit 320 may comprise a multiplexor (not shown). A common terminal of a first switch 322 is preferably coupled to the incidental port 316, while a common terminal of a second switch 324 is coupled to the reflected port 318. The switching circuit 320 is preferably configurable so that while in a first position (e.g., position "1"), the incidental port 316 is coupled to the power detector 304 and the reflected port 318 is terminated, such as by a resistor R2 coupled to ground. Likewise, while in a second position (e.g., position "2"), the switching circuit 320 is preferably configured such that the reflected port 318 is coupled to the power detector 304 and the incidental port 316 is terminated, such as by a resistor R1 coupled to ground. Each of the two resistors R1, R2 may have a resistance of about 50 ohms, as is often used for termination loads. The switching circuit 320 is preferably controllable (e.g., in either the first or second position) in response to a control signal generated by the controller 308, or by alternative control means.

The techniques of the present invention, as described herein, may be employed in a multiple RF power level environment. In accordance with one aspect of the invention adaptable for use in a multiple RF power level environment, the PA is configurable for generating a plurality of RF output power levels. The PA may comprise a bias circuit configurable for selectively generating a plurality of bias current levels. Each of the bias current levels may corresponding to a different RF output power level generated by the PA. For an RF power level lower than a maximum RF power level, the PA bias current level can be selectively adjusted to provide sufficient headroom, thus guaranteeing substantially linear operation of the PA under varying VSWR load conditions. By way of example only, when a poor VSWR is detected, such as by the reflected port of the PCL circuit, the bias current level of the PA may be operatively increased to provide more headroom for the PA, thus insuring linear operation, without necessarily increasing the RF output power level of the PA beyond a desired maximum level. Alternative techniques for controlling the amount of headroom of the PA are also contemplated by the invention, including, for example, changing an RF input power level of the PA, as will be understood by those skilled in the art.

It is to be appreciated that at least a portion of the methodologies and/or components of the present invention, as described herein, may be implemented in accordance with one or more semiconductor devices, such as, for example, an integrated circuit (IC) chipset.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims. For example, the invention can be used with standards other than IEEE 802.11 (e.g., IEEE 802.15), as well as in non-standard applications.

What is claimed is:

1. An amplifier circuit for use in a wireless transmission system capable of operating in one of at least two different modulation modes, each of the modulation modes having a corresponding desired data rate associated therewith, the amplifier circuit comprising:

an attenuator configurable for receiving an input signal associated with one of the at least two modulation modes of the transmission system, the attenuator being operative to control an attenuation of the input signal;

an amplifier coupled to the attenuator, the amplifier receiving the attenuated input signal and generating an amplified output signal;

at least one power detector configurable to independently detect at least a portion of an incidental wave and a reflected wave corresponding to the amplified output signal and to generate first and second signals representative of the detected incidental and reflected waves, respectively; and a controller operatively coupled between the at least one power detector and the attenuator in a feedback configuration, the controller controlling at least one of the attenuation of the input signal and an amplification of the input signal as a function of the first and second signals from the power detector and being operative to control a linearity of the amplifier such that the desired data rate of the received input signal is substantially maintained for the corresponding modulation mode of the transmission system;

whereby the output signal of the amplifier circuit is maintained at a substantially constant power level.

2. The amplifier circuit of claim 1, wherein the at least one power detector is selectively operable in at least one of a first mode and a second mode, the at least one power detector in the first mode receiving at least a portion of the incidental wave corresponding to the amplified output signal and generating the first signal comprising a direct current (DC) value representative of a power level of the incidental wave, and the at least one power detector in the second mode receiving at least a portion of a reflected wave corresponding to the amplified output signal and generating the second signal comprising a DC value representative of a power level of the reflected wave.

3. An amplifier circuit having a controllable output power level, comprising:

an attenuator configurable for receiving an input signal and being operative to control an attenuation thereof;

an amplifier coupled to the attenuator, the amplifier receiving the attenuated input signal and generating an amplified output signal;

at least one power detector configurable to independently detect at least a portion of an incidental wave and a reflected wave corresponding to the amplified output signal and to generate first and second signals representative of the detected incidental and reflected waves, respectively, the at least one power detector being selectively operable in at least one of a first mode and a second mode, the at least one power detector in the first mode receiving at least a portion of the incidental wave corresponding to the amplified output signal and generating the first signal comprising a direct current (DC) value representative of a power level of the incidental wave, and the at least one power detector in the second mode receiving at least a portion of a reflected wave corresponding to the amplified output signal and generating the second signal comprising a DC value representative of a power level of the reflected wave;

a switching circuit operatively coupled to the at least one power detector, the switching circuit generating a control signal for selectively controlling a mode of operation of the at least one power detector; and a controller operatively coupled between the at least one power detector and the attenuator in a feedback configuration, the controller controlling at least one of the attenuation of the input signal and an amplification of the input signal as a function of the first and second signals from the power detector;

whereby the output signal of the amplifier circuit is maintained at a substantially constant power level.

4. The amplifier circuit of claim 1, further comprising a directional coupler including an incidental port and a reflected port operatively coupled to the at least one power detector, the incidental port being configurable for sampling at least a portion of the incidental wave, and the reflected port being configurable for sampling at least a portion of the reflected wave.

5. The amplifier circuit of claim 1, wherein the at least one power detector comprises:

a first power detector circuit for detecting the at least a portion of the incidental wave and generating the first signal representative of the detected incidental wave; and a second power detector circuit for detecting the at least a portion of the reflected wave and generating the second signal representative of the detected reflected wave;

wherein the first and second power detector circuits are configurable to substantially simultaneously detect the incidental and reflected waves, respectively.

6. The amplifier circuit of claim 1, wherein the controller further comprises:

an analog-to-digital converter configurable for receiving the first and second signals from the power detector and generating first and second digital codes, respectively, in response thereto;

wherein the controller is operative: (i) to compare the first digital code with a first predetermined value representing a desired incidental power level of the amplifier circuit; (ii) to compare the second digital code with a second predetermined value representing a desired reflected power level of the amplifier circuit; and (iii) to generate the control signal in response to the comparison of the first and second digital codes with the first and second predetermines values, respectively, for controlling the attenuator for maintaining the output signal of the amplifier at a substantially constant power level.

7. The amplifier circuit of claim 6, wherein at least one of the first and second predetermined values are stored in memory.

8. The amplifier circuit of claim 1, wherein the at least one power detector comprises a logarithmic amplifier.

9. The amplifier circuit of claim 1, wherein the amplifier is configurable for selectively generating a plurality of output power levels.

10. The amplifier circuit of claim 1, wherein the amplifier comprises a bias circuit configurable for selectively generating a plurality of bias current levels.

11. The amplifier circuit of claim 10, wherein a bias current level of the amplifier is selectively adjusted in response to at least a power level of the reflected wave detected by the at least one power detector, whereby a linearity of the amplifier is substantially maintained.

12. The amplifier circuit of claim 1, wherein at least a portion of the attenuator, the amplifier, the at least one power detector, and the controller associated with the amplifier circuit are implemented in accordance with one or more semiconductor devices.

13. In a wireless transmission system capable of operating in one of at least two different modulation modes, each of the modulation modes having a corresponding desired data rate associated therewith, a method for controlling a linearity of an amplifier such that a desired data rate of an input signal received by the amplifier is maintained for a given one of the modulation modes of the transmission system, the method comprising the steps of:

generating a first signal representative of at least a portion of an incidental wave corresponding to an output signal generated by the amplifier;

generating a second signal representative of at least a portion of a reflected wave corresponding to the output signal from the amplifier;

comparing the first and second signals with desired incidental and reflected power levels of the amplifier corresponding to a given one of the at least two different modulation modes; and controlling at least one of an attenuation and an amplification of an input signal to the amplifier as a function of the first and second signals, so as to control a linearity of the amplifier such that the desired data rate of the input signal is substantially maintained for the corresponding modulation mode of the transmission system.

14. The method of claim 13, wherein the steps of generating the first and second signals are performed substantially simultaneously.

15. The method of claim 13, further comprising the step of adjusting a bias current level of the amplifier in response to at least the second signal so as to maintain a linearity of the output signal from the amplifier.

16. The method of claim 13, further comprising the step of adjusting an input power level of the amplifier so as to maintain a linearity of the output signal from the amplifier.

17. The method of claim 13, wherein the step of generating the first signal comprises converting at least a portion of the incidental wave to a first digital code representative thereof, and the step of generating the second signal comprises converting at least a portion of the reflected wave to a second digital code representative thereof.

18. The method of claim 17, wherein the step of comparing the first and second signals with desired incidental and reflected power levels of the amplifier circuit comprises comparing the first digital code with a first digital representation of the desired incidental power level and comparing the second digital code with a second digital representation of the desired reflected power level.

19. Apparatus comprising one or more semiconductor devices, the one or more semiconductor devices comprising at least one amplifier circuit for use in a wireless transmission system capable of operating in one of at least two different modulation modes, each of the modulation modes having a corresponding desired data rate associated therewith, the at least one amplifier circuit comprising:

an attenuator configurable for receiving an input signal associated with one of the at least two modulation modes of the transmission system, the attenuator being operative to control an attenuation of the input signal;

an amplifier coupled to the attenuator, the amplifier receiving the attenuated input signal and generating an amplified output signal;

at least one power detector configurable to detect at least a portion of an incidental wave and a reflected wave corresponding to the amplified output signal and to generate first and second signals representative of the detected incidental and reflected waves, respectively; and a controller operatively coupled between the at least one power detector and the attenuator in a feedback configuration, the controller controlling at least one of the attenuation of the input signal and an amplification of the input signal as a function of the first and second signals from the power detector and being operative to control a linearity of the amplifier such that the desired data rate of the received input signal is substantially maintained for the corresponding modulation mode of the transmission system;

whereby the output signal of the at least one amplifier circuit is maintained at a substantially constant power level.

20. The apparatus of claim 19, wherein the at least one power detector is selectively operable in at least one of a first mode and a second mode, the at least one power detector in the first mode receiving at least a portion of the incidental wave corresponding to the amplified output signal and generating the first signal comprising a direct current (DC) value representative of a power level of the incidental wave, and the at least one power detector in the second mode receiving at least a portion of a reflected wave corresponding to the amplified output signal and generating the second signal comprising a DC value representative of a power level of the reflected wave.

21. Apparatus comprising one or more semiconductor devices, the one or more semiconductor devices comprising at least one amplifier circuit having a controllable output power level, the at least one amplifier circuit comprising:

an attenuator configurable for receiving an input signal and being operative to control an attenuation thereof;

an amplifier coupled to the attenuator, the amplifier receiving the attenuated input signal and generating an amplified output signal;

at least one power detector configurable to independently detect at least a portion of an incidental wave and a reflected wave corresponding to the amplified output signal and to generate first and second signals representative of the detected incidental and reflected waves, respectively, the at least one power detector being selectively operable in at least one of a first mode and a second mode, the at least one power detector in the first mode receiving at least a portion of the incidental wave corresponding to the amplified output signal and generating the first signal comprising a direct current (DC) value representative of a power level of the incidental wave, and the at least one power detector in the second mode receiving at least a portion of a reflected wave corresponding to the amplified output signal and generating the second signal comprising a DC value representative of a power level of the reflected wave;

a switching circuit operatively coupled to the at least one power detector, the switching circuit generating a control signal for selectively controlling a mode of operation of the at least one power detector; and a controller operatively coupled between the at least one power detector and the attenuator in a feedback configuration, the controller controlling at least one of the attenuation of the input signal and an amplification of the input signal as a function of the first and second signals from the power detector;

whereby the output signal of the amplifier circuit is maintained at a substantially constant power level.

\* \* \* \* \*